United States Patent
Cui et al.

(10) Patent No.: US 12,387,975 B2
(45) Date of Patent: *Aug. 12, 2025

(54) THERMAL PROCESS CHAMBER LID WITH BACKSIDE PUMPING

(71) Applicant: Applied Materials, Inc., Santa Clara, CA (US)

(72) Inventors: Anqing Cui, Palo Alto, CA (US); Dien-Yeh Wu, San Jose, CA (US); Wei V. Tang, Santa Clara, CA (US); Yixiong Yang, Fremont, CA (US); Bo Wang, Chandler, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/208,409

(22) Filed: Jun. 12, 2023

(65) Prior Publication Data

US 2023/0335434 A1 Oct. 19, 2023

Related U.S. Application Data

(63) Continuation of application No. 17/720,836, filed on Apr. 14, 2022, now Pat. No. 11,715,667, which is a
(Continued)

(51) Int. Cl.
*H01L 21/768* (2006.01)
*C23C 16/02* (2006.01)
(Continued)

(52) U.S. Cl.
CPC ........ *H01L 21/76826* (2013.01); *C23C 16/02* (2013.01); *C23C 16/45553* (2013.01);
(Continued)

(58) Field of Classification Search
CPC .................................................. C23C 16/4412
See application file for complete search history.

(56) References Cited

U.S. PATENT DOCUMENTS

| | | | |
|---|---|---|---|
| 6,106,625 A * | 8/2000 | Koai | C23C 16/455 118/724 |
| 9,175,394 B2 | 11/2015 | Yudovsky et al. | |
| 11,335,591 B2 * | 5/2022 | Cui | C23C 16/4408 |
| 11,715,667 B2 * | 8/2023 | Cui | H01L 21/68771 438/656 |
| 2002/0023907 A1 * | 2/2002 | Morishige | G03F 1/72 219/121.84 |

(Continued)

FOREIGN PATENT DOCUMENTS

| | | |
|---|---|---|
| JP | 2007270352 A | 10/2007 |
| JP | 2010212335 A | 9/2010 |

(Continued)

OTHER PUBLICATIONS

Machine Translation of JP2010212335, 23 pages.
PCT International Search Report and Written Opinion in PCT/US2020/034903 dated Sep. 11, 2020, 13 pages.

*Primary Examiner* — Erik Kielin
(74) *Attorney, Agent, or Firm* — SERVILLA WHITNEY LLC

(57) ABSTRACT

Process chamber lid assemblies and process chambers comprising same are described. The lid assembly has a housing with a gas dispersion channel in fluid communication with a lid plate. A contoured bottom surface of the lid plate defines a gap to a top surface of a gas distribution plate. A pumping channel is formed between an upper outer peripheral contour of the gas distribution plate and the lid plate.

19 Claims, 8 Drawing Sheets

Related U.S. Application Data continuation of application No. 16/886,116, filed on May 28, 2020, now Pat. No. 11,335,591.

(60) Provisional application No. 62/853,699, filed on May 28, 2019.

(51) Int. Cl.
| | |
|---|---|
| *C23C 16/455* | (2006.01) |
| *C23C 16/458* | (2006.01) |
| *H01L 21/02* | (2006.01) |
| *H01L 21/285* | (2006.01) |
| *H01L 21/48* | (2006.01) |
| *H01L 21/687* | (2006.01) |
| *H01L 23/532* | (2006.01) |

(52) U.S. Cl.
CPC ...... *C23C 16/4584* (2013.01); *H01L 21/0228* (2013.01); *H01L 21/28568* (2013.01); *H01L 21/4871* (2013.01); *H01L 21/68764* (2013.01); *H01L 21/68771* (2013.01); *H01L 21/76843* (2013.01); *H01L 21/76861* (2013.01); *H01L 21/76877* (2013.01); *H01L 23/53266* (2013.01)

(56) References Cited

U.S. PATENT DOCUMENTS

| | | | |
|---|---|---|---|
| 2005/0208217 | A1 | 9/2005 | Shinriki et al. |
| 2007/0169373 | A1* | 7/2007 | Aoki .......... F26B 3/20 |
| | | | 34/443 |
| 2008/0202416 | A1 | 8/2008 | Provencher et al. |
| 2010/0166957 | A1 | 7/2010 | Sneh |
| 2013/0267045 | A1 | 10/2013 | Lee et al. |
| 2014/0103145 | A1* | 4/2014 | White ........ C23C 16/45565 |
| | | | 239/548 |
| 2015/0093913 | A1 | 4/2015 | Toyoda et al. |
| 2015/0340226 | A1 | 11/2015 | Ashihara et al. |
| 2016/0097119 | A1 | 4/2016 | Cui et al. |
| 2016/0312360 | A1 | 10/2016 | Rasheed et al. |
| 2016/0319424 | A1 | 11/2016 | Takahashi |
| 2017/0009347 | A1 | 1/2017 | Jang et al. |
| 2017/0101710 | A1* | 4/2017 | Chandrasekharan ......... |
| | | | H01L 21/6719 |
| 2017/0283945 | A1 | 10/2017 | Yahata et al. |

FOREIGN PATENT DOCUMENTS

| | | |
|---|---|---|
| JP | 2016204729 A | 12/2016 |
| JP | 2017183383 A | 10/2017 |
| KR | 100754537 B1 | 9/2007 |
| KR | 20180054366 A | 5/2018 |

\* cited by examiner

THERMAL PROCESS CHAMBER LID WITH BACKSIDE PUMPING

CROSS-REFERENCE TO RELATED APPLICATIONS

This application is a continuation of U.S. patent application Ser. No. 17/720,836, filed Apr. 14, 2022, which is a continuation of U.S. patent application Ser. No. 16/886,116, filed May 28, 2020, now U.S. Pat. No. 11,335,591, issued May 17, 2022, which claims priority to U.S. Provisional Application No. 62/853,699, filed May 28, 2019, the entire disclosures of which are hereby incorporated by reference herein.

TECHNICAL FIELD

Embodiments of the present disclosure pertain to the field of electronic device manufacturing. In particular, embodiments of the disclosure are directed to apparatus for delivering reactive gases in semiconductor device manufacturing.

BACKGROUND

Reliably producing submicron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of VLSI and ULSI technology use precise processing of high aspect ratio features, such as vias and other interconnects. Reliable formation of these interconnects is very important to VLSI and ULSI success and to the continued effort to increase circuit density and quality of individual substrates.

As circuit densities increase, the widths of interconnects, such as vias, trenches, contacts, and other features, as well as the dielectric materials between, decrease while the thickness of the dielectric layers remain substantially constant, resulting in increased height-to-width aspect ratios of the features. Many traditional deposition processes have difficulty filling submicron structures and providing good step coverage for surface features.

Atomic layer deposition (ALD) is a deposition technique being explored for the deposition of material layers over features having high aspect ratios. One example of an ALD process includes the sequential introduction of pulses of gases. For instance, one cycle for the sequential introduction of pulses of gases may contain a pulse of a first reactant gas, followed by a pulse of a purge gas and/or a pump evacuation, followed by a pulse of a second reactant gas, and followed by a pulse of a purge gas and/or a pump evacuation. The term "gas" as used herein is defined to include a single gas or a plurality of gases. Sequential introduction of separate pulses of the first reactant and the second reactant may result in the alternating self-limiting adsorption of monolayers of the reactants on the surface of the substrate and, thus, forms a monolayer of material for each cycle. The cycle may be repeated to form a film with a predetermined thickness. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber.

In some chamber designs for ALD processing, precursors and gases are delivered using a funnel lid through which precursor is distributed through multiple injectors above a funnel shaped lid. The injectors generate a circular motion of the injected gas which distributes through the funnel profile at the center of the lid. The rotational inertia of the gas/ALD precursor molecules distributes the molecules from center to edge resulting in improved uniformity deposition.

It has been observed that reactive gases become trapped between the lid plate and the showerhead during processing resulting in non-uniformity of the deposited films. Accordingly, there is an ongoing need in the art for methods and apparatus to improve uniformity of deposited films.

SUMMARY

One or more embodiments of the disclosure are directed to process chamber lid assemblies. A housing encloses a gas dispersion channel that extends along a central axis of the housing. The gas dispersion channel has an upper portion and a lower portion. A lid plate is coupled to the housing and has a contoured bottom surface that extends downwardly and outwardly from a central opening coupled to the lower portion of the gas dispersion channel to a peripheral portion of the lid plate. A gas distribution plate is disposed below the lid plate and has an upper outer peripheral contour configured to form a pumping channel between the gas distribution plate and the lid plate. The gas distribution plate has a top surface and a bottom surface with a plurality of apertures disposed through the gas distribution plate from the top surface to the bottom surface. The contoured bottom surface of the lid plate and top surface of the gas distribution plate define a gap.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

Figure 1:
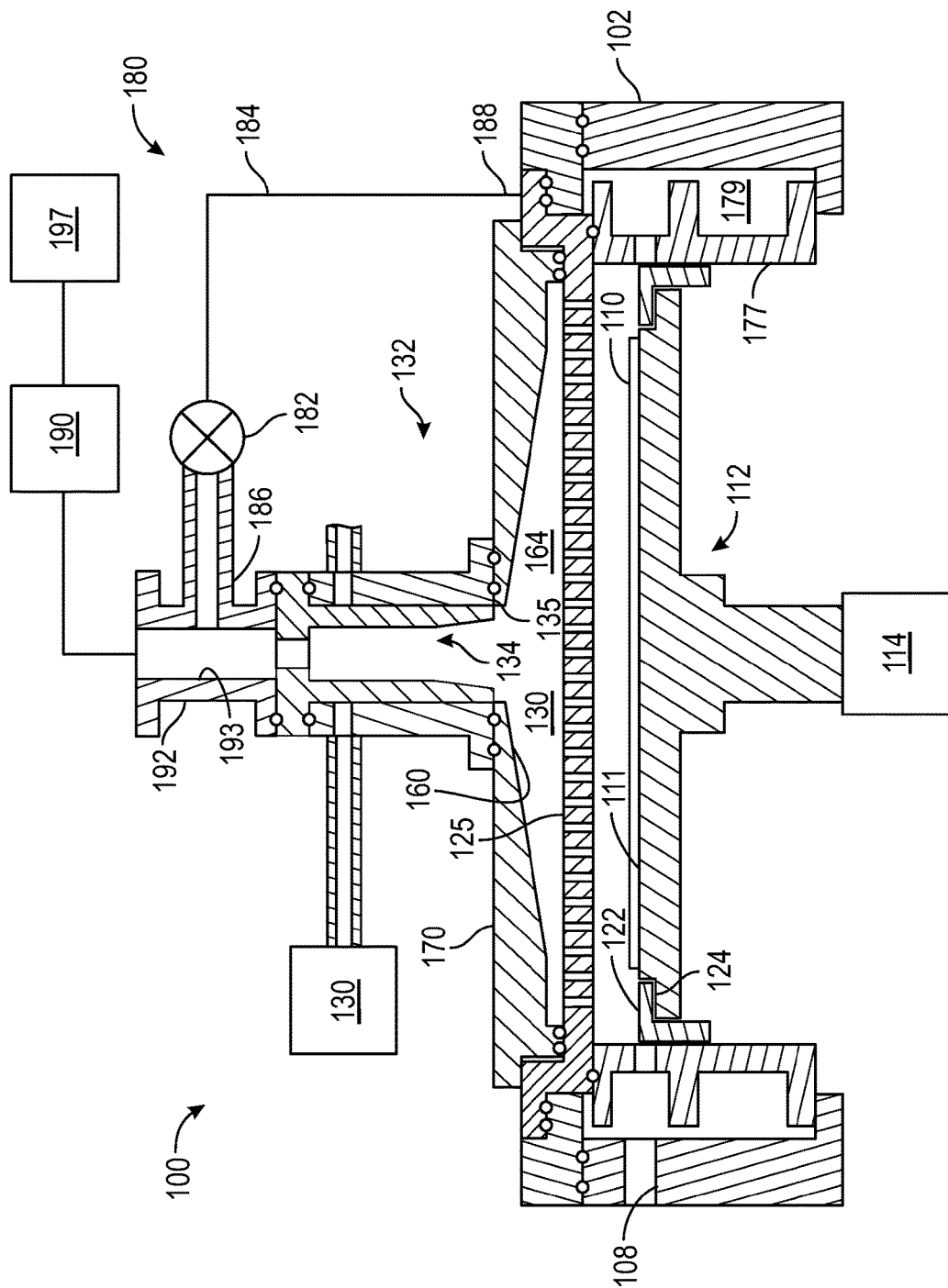
FIG. 1 depicts a schematic view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Embodiments of the present disclosure provide apparatus and methods that may be used to clean substrate processing chambers, such as an atomic layer deposition (ALD) chamber, and to deposit materials during, for example, an ALD process. Embodiments include substrate processing chambers and gas delivery systems which may include a remote plasma source and a gas distribution plate. The following process chamber description is provided for context and exemplary purposes, and should not be interpreted or construed as limiting the scope of the disclosure.

Figure 2:
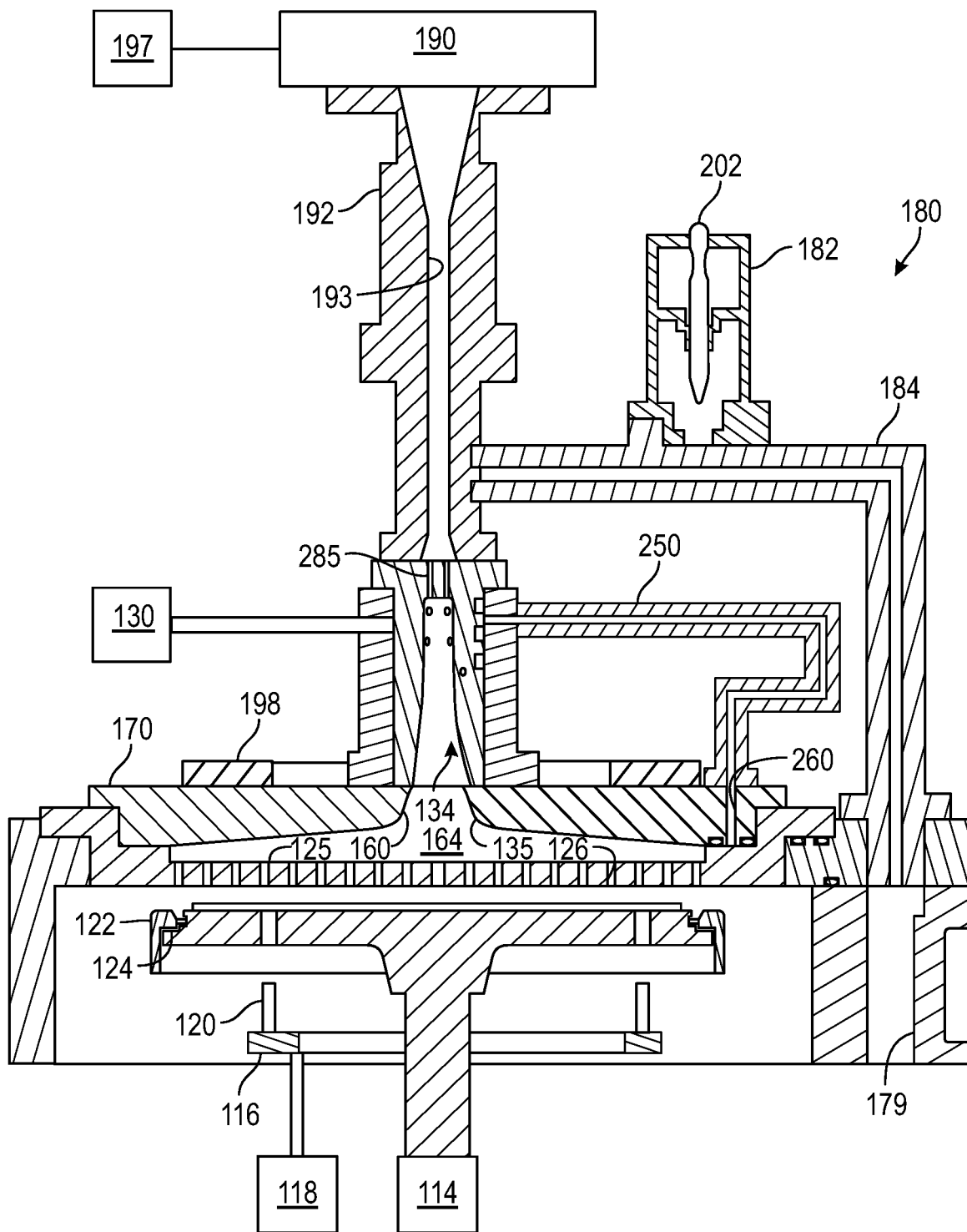
FIG. 2 depicts a schematic cross-sectional view of a process chamber in accordance with some embodiments of the present disclosure.

FIG. 1 is a schematic view of a substrate processing chamber (process chamber 100) including a gas delivery system 130 adapted for ALD processes in accordance with some embodiments of the present disclosure. FIG. 2 is a cross-sectional view of the process chamber 100. Process chamber 100 includes a chamber body 102 having a processing volume within the chamber body 102 and beneath the chamber lid assembly 132. Slit valve 108 in the process chamber 100 provides access for a robot (not shown) to deliver and retrieve a substrate 110, such as a 200 mm or 300 mm semiconductor wafer or a glass substrate, to and from the process chamber 100. A chamber liner 177 is disposed along the walls of the process chamber 100 to protect the chamber from corrosive gases used during processing/cleaning.

A substrate support 112 supports the substrate 110 on a substrate receiving surface 111 in the process chamber 100. The substrate support 112 is mounted to a lift motor 114 for raising and lowering the substrate support 112 and the substrate 110 disposed on the substrate support. A lift plate 116 (shown in FIG. 2), connected to a lift motor 118, is mounted in the process chamber 100 to raise and lower lift pins 120 movably disposed through the substrate support 112. The lift pins 120 raise and lower the substrate 110 over the surface of the substrate support 112. The substrate support 112 may include a vacuum chuck (not shown), an electrostatic chuck (not shown), or a clamp ring (not shown) for securing the substrate 110 to the substrate support 112 during a deposition process.

The temperature of the substrate support 112 may be adjusted to control the temperature of the substrate 110. For example, substrate support 112 may be heated using an embedded heating element, such as a resistive heater (not shown), or may be heated using radiant heat, such as heating lamps (not shown) disposed above the substrate support 112. A purge ring 122 may be disposed on the substrate support 112 to define a purge channel 124 which provides a purge gas to a peripheral portion of the substrate 110 to prevent deposition on the peripheral portion of the substrate 110.

Gas delivery system 130 is disposed at an upper portion of the chamber body 102 to provide a gas, such as a process gas and/or a purge gas, to process chamber 100. A vacuum system (not shown) is in communication with a pumping channel 179 to evacuate any desired gases from the process chamber 100 and to help maintain a desired pressure or pressure range inside the process chamber 100.

In some embodiments, the chamber lid assembly 132 includes a gas dispersion channel 134 extending through a central portion of the chamber lid assembly 132. As shown in FIGS. 1 and 2, the gas dispersion channel 134 extends perpendicularly toward the substrate receiving surface 111 and also extends along a central axis 133 of the gas dispersion channel 134, through lid plate 170, and to bottom surface 160. In some embodiments, an upper portion of the gas dispersion channel 134 is substantially cylindrical along central axis 133 and a lower portion of the gas dispersion channel 134 tapers away from central axis 133. The bottom surface 160 is sized and shaped to substantially cover the substrate 110 disposed on the substrate receiving surface 111 of the substrate support 112. The bottom surface 160 tapers from an outer edge of the lid plate 170 towards the gas dispersion channel 134. The gas delivery system 130 may provide one or more gasses to the gas dispersion channel 134 to process the substrate 110. In some embodiments, the gas delivery system 130 may be coupled to the gas dispersion channel 134 via one gas inlet. In some embodiments, such as that shown in FIG. 3, the gas delivery system may be coupled to the gas dispersion channel 134 via a plurality of inlets.

Figure 3:
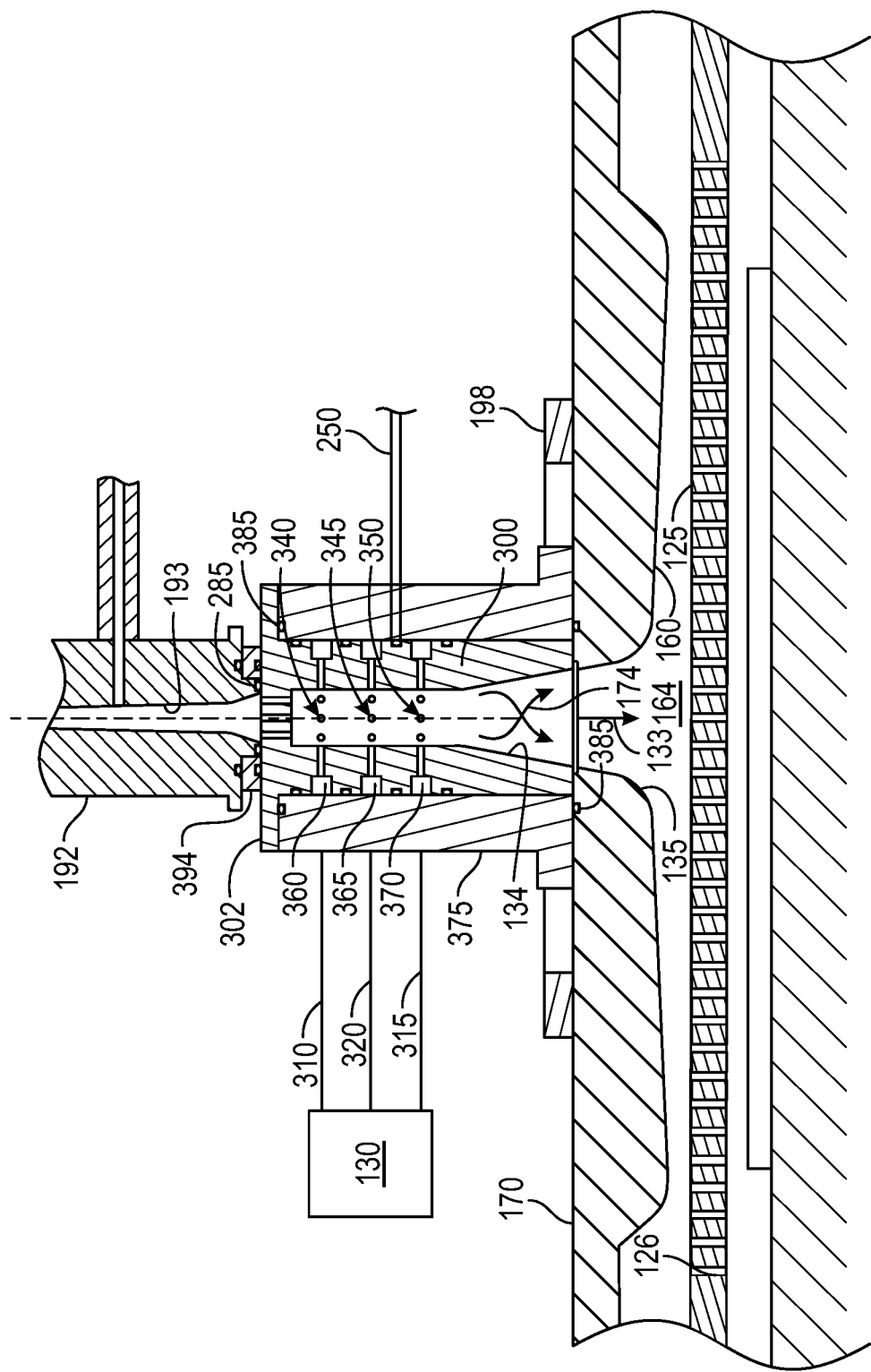
FIG. 3 depicts a schematic cross-sectional view of a lid assembly in accordance with some embodiments of the present disclosure.

As illustrated in FIG. 3, circular gas flow 174, which illustrates the flow of process gases through the gas dispersion channel 134, may contain various types of flow patterns. In some embodiments, processing gases may be forced to make revolutions around central axis 133 of gas dispersion channel 134 while passing through the dispersion channel. In such embodiments, the circular gas flow 174 may contain various types of circular flow patterns, such as a vortex pattern, a helix pattern, a spiral pattern, or derivatives thereof.

Although providing a circular gas flow 174 is beneficial for many applications, the inventors have discovered that in some applications, the circular gas flow can lead to non-uniform processing results. The inventors have observed the gas flow may lead to a donut-shaped deposition profile near a center of the substrate 110 being processed. The donut-shaped profile may be caused by the funnel shape of gas dispersion channel 134. Therefore, in some embodiments, the process chamber 100 further includes a gas distribution plate 125 having a plurality of apertures 126 disposed through the gas distribution plate 125. The gas distribution plate 125 extends to the surface of the gas dispersion channel 134 such that the only pathway from the gas dispersion channel 134 to the substrate is through the plurality of apertures 126 of the gas distribution plate 125. The gas distribution plate 125 advantageously creates a choked flow of gas through the gas distribution plate 125 resulting in a more uniform deposition on the substrate 110 and, thus, substantially eliminating the donut-shaped deposition caused by the rotational flow of gas.

In some embodiments, the gas distribution plate 125 is formed of a non-corrosive ceramic material such as, for example, aluminum oxide or aluminum nitride. In some embodiments, each of the plurality of apertures 126 may have an equivalent fluid conductance. In some embodiments, a density of the plurality of apertures 126 (e.g., the number of apertures or the size of the openings of the apertures per unit area) may vary across the gas distribution plate 125 to achieve a desired deposition profile on the substrate 110. For example, a higher density of apertures 126 may be disposed at a center of the gas distribution plate 125 to increase the deposition rate at the center of the substrate relative to the edge of the substrate to further improve deposition uniformity.

Figure 4A:
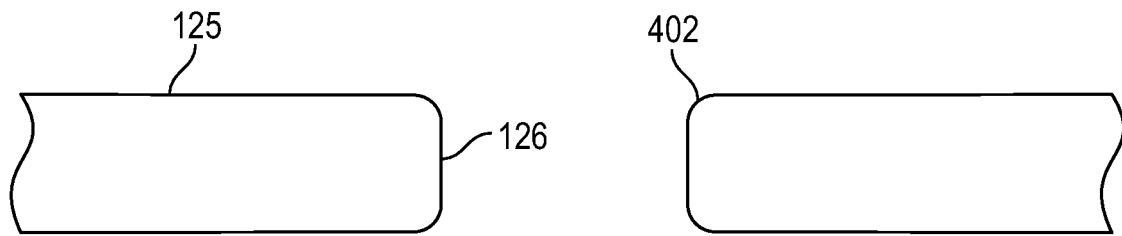
FIGS. 4A-C depict schematic views of apertures disposed through a gas distribution plate in accordance with embodiments of the present disclosure.
Figure 4B:
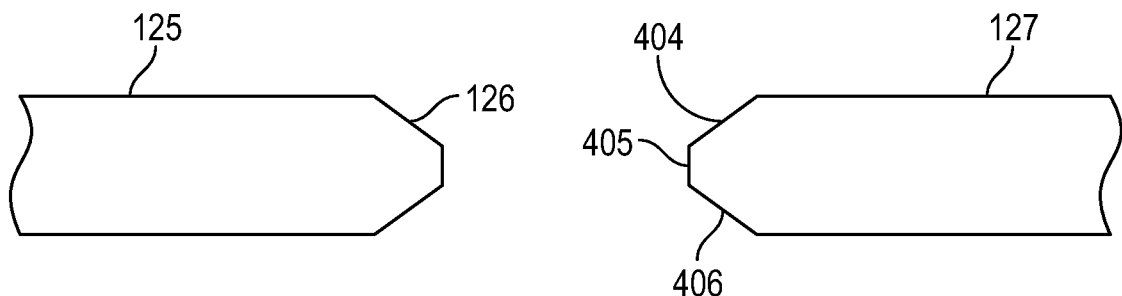
Figure 4C:
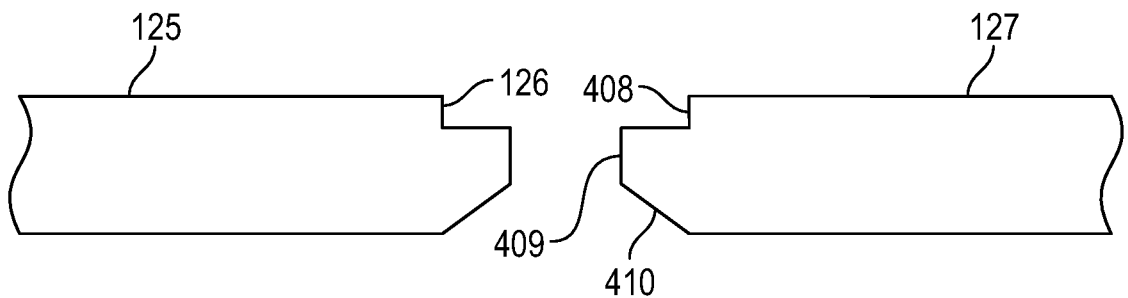

Although the plurality of apertures 126 are depicted as cylindrical through holes, the plurality of apertures 126 may have different profiles. FIGS. 4A-C depict different non-limiting embodiments of profiles of the plurality of apertures 126. In the embodiment depicted in FIG. 4A, the aperture 126 is a cylindrical through hole having curved edges 402 that surround the aperture. In the embodiment depicted in FIG. 4B, the aperture 126 is a through hole having an upper portion 404 that tapers inwardly toward a center of the aperture, a cylindrical center portion 405 extending perpendicularly to an upper surface 127 of the gas distribution plate 125, and a lower portion 406 that tapers outwardly from the center of the aperture. In the embodiment depicted in FIG. 4C, the aperture 126 is a through hole having an upper portion 408 having a countersunk hole, a cylindrical center portion 409 extending perpendicularly to the upper surface 127 of the gas distribution plate 125, and a lower portion 410 that tapers outwardly from the center of the aperture. Other profiles of the plurality of apertures 126 may alternatively be used to achieve optimal deposition uniformity during processing of the substrate 110.

Not wishing to be bound by theory, the inventors believe that the diameter of gas dispersion channel 134, which is constant from the upper portion of gas dispersion channel 134 to a first point along central axis 133 and increasing from the first point to lower portion 135 of gas dispersion channel 134, allows less of an adiabatic expansion of a gas through gas dispersion channel 134 which helps to control the temperature of the process gas contained in the circular gas flow 174. For example, a sudden adiabatic expansion of a gas delivered into gas dispersion channel 134 may result in a drop in the temperature of the gas which may cause condensation of the gas and formation of droplets. On the other hand, a gas dispersion channel 134 that gradually tapers is believed to provide less of an adiabatic expansion of a gas. Therefore, more heat may be transferred to or from the gas, and, thus, the temperature of the gas may be more easily controlled by controlling the temperature of chamber lid assembly 132. Gas dispersion channel 134 may gradually taper and contain one or more tapered inner surfaces, such as a tapered straight surface, a concave surface, a convex surface, or combinations thereof or may contain sections of one or more tapered inner surfaces (i.e., a portion tapered and a portion non-tapered).

As shown in FIG. 3, the upper portion of the gas dispersion channel 134 is defined by an insert 300 disposed in an inner region of a housing 375. The insert 300 includes a cap 302 at an upper portion of the insert 300 and a central passageway that at least partially defines the gas dispersion channel 134. The cap 302 extends over the housing 375 to hold the insert 300 in place. The insert 300 and cap 302 include a plurality of o-rings 385 disposed between the insert 300 and the housing 375 to ensure proper sealing. The insert 300 includes a plurality of circumferential apertures which, when the insert 300 is inserted into the housing 375, form a corresponding plurality of circumferential channels 360, 365, 370. The plurality of circumferential channels 360, 365, 370 are fluidly coupled to the gas dispersion channel 134 via a corresponding plurality of holes 340, 345, 350. In the embodiment shown in FIG. 3, the gas delivery system 130 is coupled to the gas dispersion channel 134 via a plurality of gas feed lines 310, 315, 320. The gas feed lines 310, 315, 320 are fluidly coupled to the plurality of circumferential channels 360, 365, 370 to provide one or more gases to the gas dispersion channel 134.

Returning to FIGS. 1 and 2, the process chamber 100 further includes a chamber cleaning system including a remote plasma source (RPS) 190, an isolation collar 192 coupled to the RPS 190 at one end and the cap 302 at an opposite end, a heater plate 198 coupled to an upper surface of the lid plate 170, and a cleaning gas (i.e., purge gas) source 197 fluidly coupled to the RPS 190. The cleaning gas source may include any gas suitable for forming a plasma to clean the process chamber 100. In some embodiments, for example, the cleaning gas may be nitrogen trifluoride ($NF_3$). The isolation collar 192 includes an inner channel 193 that is fluidly coupled to the gas dispersion channel 134 through a plurality of holes 285 disposed in a central portion of the cap 302 to flow a plasma from the RPS 190 through the gas dispersion channel 134 and into the reaction zone 164. The heater plate 198 may be formed of stainless steel and include a plurality of resistive heating elements dispersed throughout the plate.

Typically, a cleaning gas is flowed through the gas dispersion channel 134 and the reaction zone 164 after a first gas is provided to the gas dispersion channel 134 by the gas delivery system 130 to quickly purge the first gas from the gas dispersion channel 134 and the reaction zone 164. Subsequently, a second gas is provided by the gas delivery system 130 to the gas dispersion channel 134 and the cleaning gas is again flowed through the gas dispersion channel 134 to the reaction zone 164 to quickly purge the second gas from the gas dispersion channel 134 and the reaction zone 164. However, the addition of the gas distribution plate 125 chokes the flow of the cleaning gas to the pumping channel 179 and prolongs the cleaning process. As such, the inventors have incorporated an exhaust system 180 having an exhaust conduit 184 coupled to the isolation collar 192 at a first end 186 and to the pumping channel 179 at a second end 188. A valve 182 is disposed in the exhaust conduit 184 to selectively fluidly couple the exhaust conduit 184 to the inner channel 193. In some embodiments, for example, the valve 182 may be a plunger type valve having a plunger 202 that is moveable between a first position (shown in FIG. 2) to fluidly couple the exhaust conduit 184 to the inner channel 193 and a second position to seal off the exhaust conduit 184 from the inner channel 193. Each time the cleaning gas is flowed through the gas dispersion channel 134 and the reaction zone 164, the valve 182 is opened and the cleaning gas is rapidly exhausted to the pumping channel 179.

When a pressure inside of the process chamber 100 exceeds a pressure inside of the RPS 190, processing gasses may flow up to and damage the RPS 190. The plurality of holes 285 serve as a choke point to prevent a backflow of processing gases from flowing up through the inner channel 193 and into the RPS 190. The isolation collar 192 may be formed of any material that is non-reactive with the cleaning gas being used. In some embodiments, the isolation collar 192 may be formed of aluminum when the cleaning gas is $NF_3$. In some embodiments, the isolation collar 192 and the insert 300 may be formed of aluminum and coated with a coating to prevent corrosion of the isolation collar 192 and the insert 300 from corrosive gases when used. For example, the coating may be formed of nickel or aluminum oxide.

Referring to FIG. 3, the RPS 190 operates at a temperature less than or equal to about 40° C. In order advantageously insulate the RPS 190 from heat generated in the process chamber 100, a thermal isolation ring 394 is disposed between the isolation collar 192 and the cap 302. The thermal isolation ring 394 is formed of a metal with low thermal conductivity (e.g., lower than the thermal conductivity of the isolation collar 192 and the cap 302). In addition, an o-ring 385 may also be disposed between the isolation collar 192 and the cap 302 to further reduce the contact area between the isolation collar 192 and the cap 302. The combination of the thermal isolation ring 394 and the o-ring 385 acts as a thermal choke to ensure that the heat generated in the process chamber 100 does not adversely affect the RPS 190.

In some embodiments, when the lid plate 170 is heated above 100° C. the process chamber 100 may include a differential pumping line 250 to ensure that any process gases or byproducts trapped between o-rings 385 are exhausted to the pumping channel 179. The differential pumping line 250 is coupled to the lid plate 170 at a first end and to the housing 375 at a second end opposite the first end. The differential pumping line is fluidly coupled to the gas dispersion channel 134 and to one or more channels 260 formed at areas between two or more o-rings 385. When the valve 182 is opened to exhaust the gas dispersion channel 134, the differential pumping line exhausts gases trapped between o-rings 385.

Returning to FIG. 3, a portion of bottom surface 160 of chamber lid assembly 132 may be contoured or angled downwardly and outwardly from a central opening coupled to the gas dispersion channel 134 to a peripheral portion of chamber lid assembly 132 to help provide an improved velocity profile of a gas flow from gas dispersion channel 134 across the surface of substrate 110 (i.e., from the center of the substrate to the edge of the substrate). Bottom surface 160 may contain one or more surfaces, such as a straight surface, a concave surface, a convex surface, or combinations thereof. In one embodiment, bottom surface 160 is convexly funnel-shaped.

In one example, bottom surface 160 is downwardly and outwardly sloping toward an edge of the substrate receiving surface 111 to help reduce the variation in the velocity of the process gases traveling between bottom surface 160 of chamber lid assembly 132 and substrate 110 while assisting to provide uniform exposure of the surface of substrate 110 to a reactant gas. The components and parts of chamber lid assembly 132 may contain materials such as stainless steel, aluminum, nickel-plated aluminum, nickel, alloys thereof, or other suitable materials. In one embodiment, lid plate 170 may be independently fabricated, machined, forged, or otherwise made from a metal, such as aluminum, an aluminum alloy, steel, stainless steel, alloys thereof, or combinations thereof.

In some embodiments, inner surface 131 of gas dispersion channel 134 and bottom surface 160 of chamber lid assembly 132 may contain a mirror polished surface to help a flow of a gas along gas dispersion channel 134 and bottom surface 160 of chamber lid assembly 132.

Referring to FIGS. 1-3, in a processing operation, substrate 110 is delivered to process chamber 100 through slit valve 108 by a robot (not shown). Substrate 110 is positioned on substrate support 112 through cooperation of lift pins 120 and the robot. Substrate support 112 raises substrate 110 into close opposition to a lower surface of the gas distribution plate 125. A first gas flow may be injected into gas dispersion channel 134 of process chamber 100 by the gas delivery system 130 together or separately (i.e., pulses) with a second gas flow. The first gas flow may contain a continuous flow of a purge gas from a purge gas source and pulses of a reactant gas from a reactant gas source or may contain pulses of a reactant gas from the reactant gas source and pulses of a purge gas from the purge gas source. The second gas flow may contain a continuous flow of a purge gas from a purge gas source and pulses of a reactant gas from a reactant gas source or may contain pulses of a reactant gas from a reactant gas source and pulses of a purge gas from a purge gas source.

The circular gas flow 174 travels through gas dispersion channel 134 and subsequently through the plurality of apertures 126 in the gas distribution plate 125. The gas is then deposited on the surface of substrate 110. Bottom surface 160 of chamber lid assembly 132, which is downwardly sloping, helps reduce the variation of the velocity of the gas flow across the surface of gas distribution plate 125. Excess gas, byproducts, etc. flow into the pumping channel 179 and are then exhausted from process chamber 100. Throughout the processing operation, the heater plate 198 may heat the chamber lid assembly 132 to a predetermined temperature to heat any solid byproducts that have accumulated on walls of the process chamber 100 (or a processing kit disposed in the chamber). As a result, any accumulated solid byproducts are vaporized. The vaporized byproducts are evacuated by a vacuum system (not shown) and pumping channel 179. In some embodiments, the predetermined temperature is greater than or equal to 150° C.

Some process conditions can cause step coverage issues due to, for example, residual precursors in the gas delivery system allowing gas phase reactions. In a typical ALD process, gas phase reactions are generally avoided. Accordingly, some embodiments of the disclosure provide process chamber lids and processing chambers with backside pumping capability to a chamber lid. The apparatus of some embodiments is a thermal chamber lid with no plasma source connected thereto. In some embodiments, the chamber lid is configured with a remote plasma source to provide a remote plasma to the process chamber.

One or more embodiments of the disclosure advantageously provide apparatus to improve step coverage of films on surface features. One or more embodiments of the disclosure advantageously provide apparatus that adds backside pumping to remove residual reactive gases. In some embodiments, the apparatus helps pump chemicals trapped between the lid plate and the showerhead more efficiently.

Figure 5:
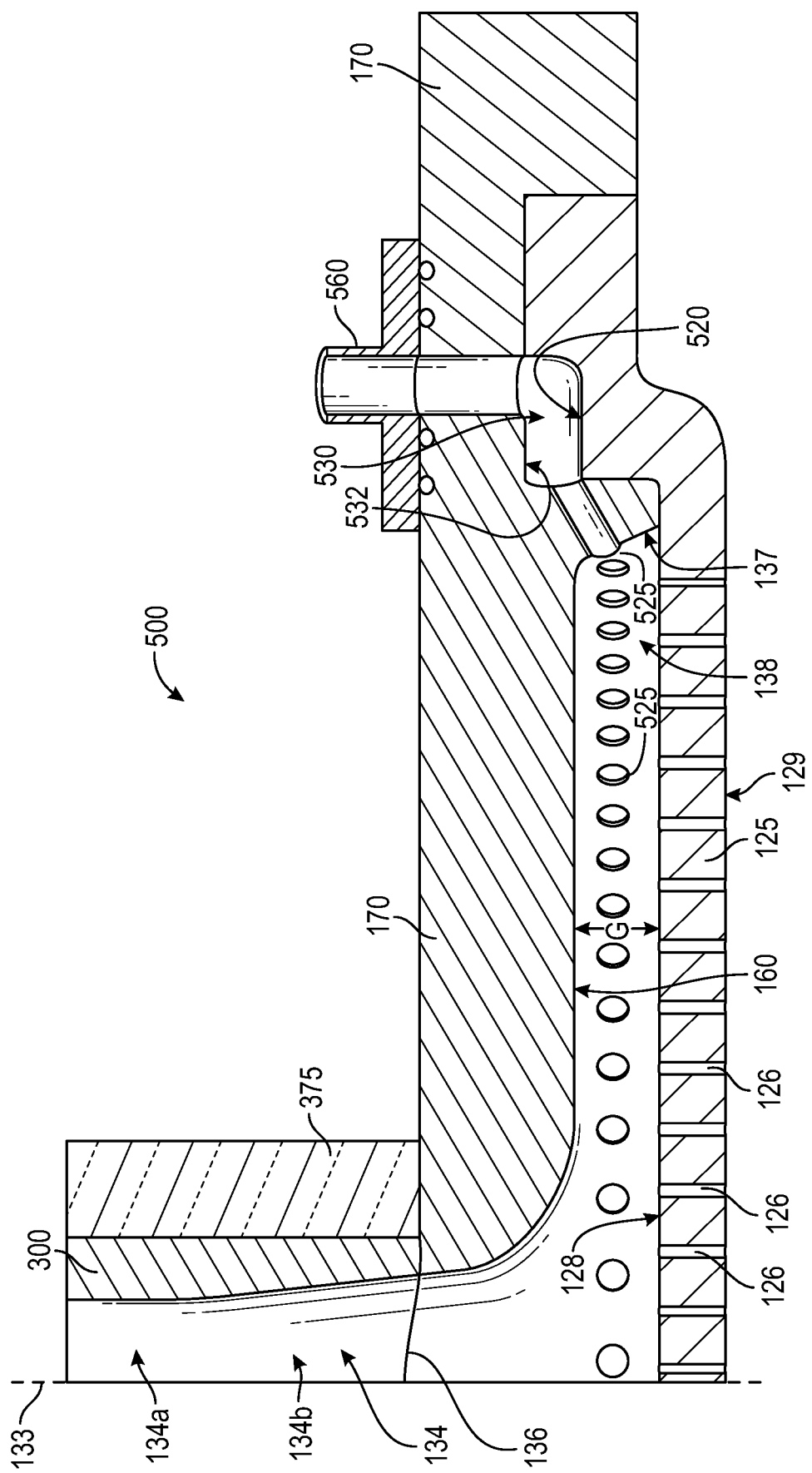
FIG. 5 shows a schematic cross-sectional view of a lid assembly in accordance with one or more embodiments of the disclosure.

FIG. 5 shows a process chamber lid assembly 500 according to one or more embodiment of the disclosure. A housing 375 encloses a gas dispersion channel 134 that extends along a central axis 133 of the housing 375. The gas dispersion channel 134 has an upper portion 134a and a lower portion 134b.

A lid plate 170 is coupled to the housing 375 and has a contoured bottom surface 160. The contoured bottom surface 160 extends downwardly and outwardly from a central opening 136 coupled to the lower portion 134b of the gas dispersion channel 134 to an outer peripheral portion 138 of the lid plate 170. In the illustrated embodiment, the outer peripheral portion 138 refers to the outer portion of the contoured bottom surface 160 adjacent the outer peripheral edge 137.

The lid assembly 500 includes a gas distribution plate 125 disposed below the lid plate 170. The gas distribution plate 125 has a top surface 128 and a bottom surface 129 with a plurality of apertures 126 disposed through the gas distribution plate 125 from the top surface 128 to the bottom surface 129.

The gas distribution plate 125 has an upper outer peripheral contour 520 configured to form a pumping channel 530 between the gas distribution plate 125 and the lid plate 170. The pumping channel 530 shown in the embodiment of FIG. 5 is defined between an outer peripheral bottom surface 532 of the lid plate 170 and the upper outer peripheral contour 520 of the gas distribution plate 125. In some embodiments, the outer peripheral bottom surface 532 of the lid plate 170 is further from the central axis 133 than the outer peripheral portion 138 of the contoured bottom surface 160. Stated differently, in some embodiments, the outer peripheral bottom surface 532 surrounds the contoured bottom surface 160.

Figure 6A:
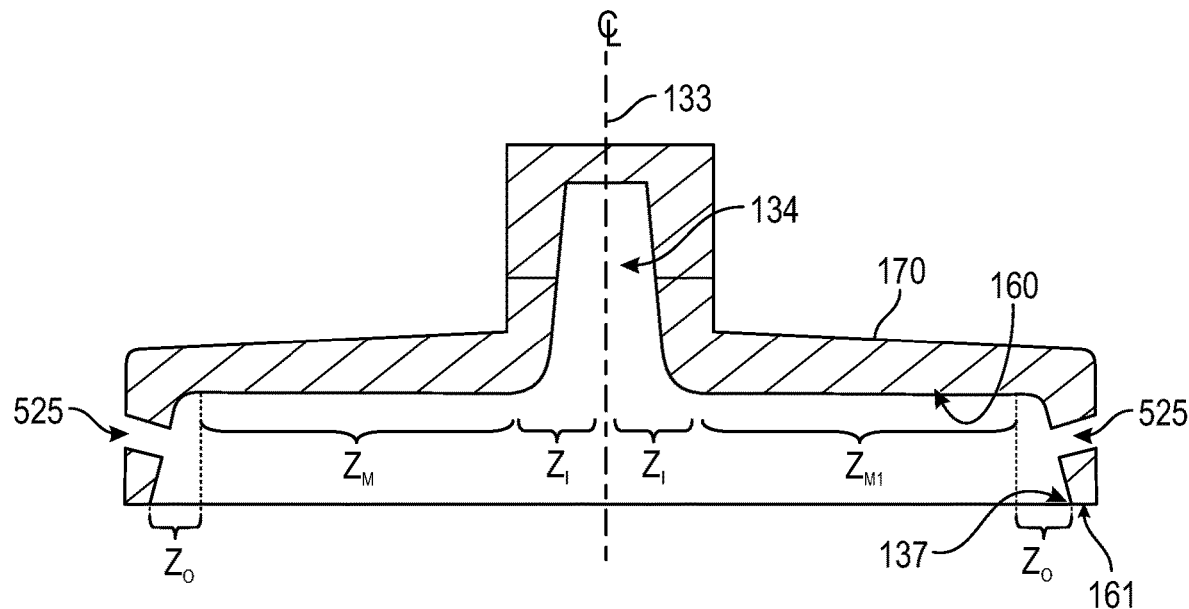
FIG. 6A shows a schematic cross-sectional view of a lid plate in accordance with one or more embodiments of the disclosure.
Figure 6B:
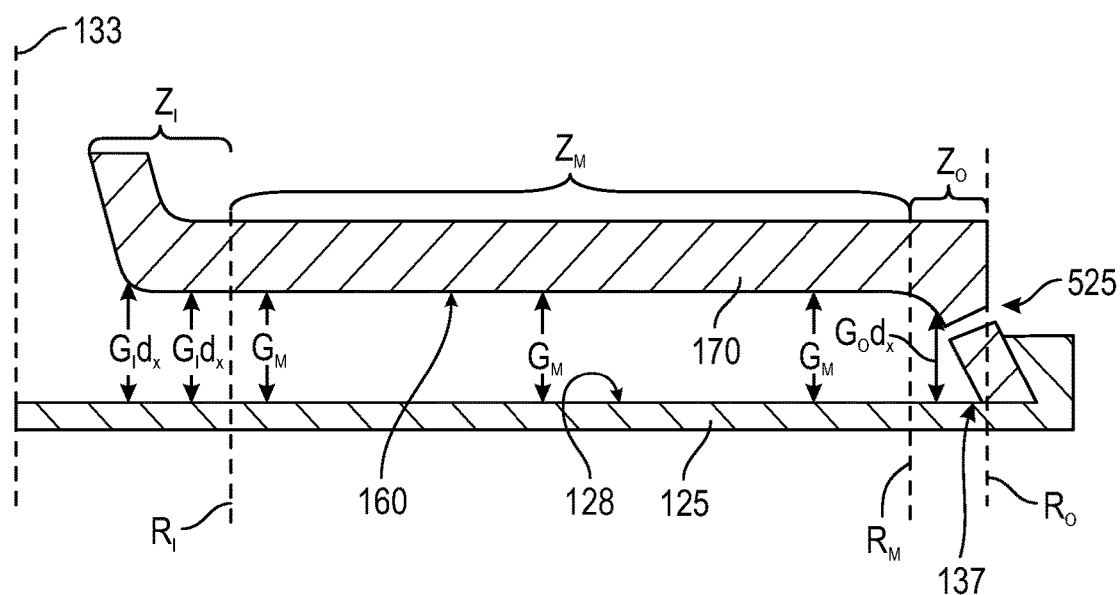
FIG. 6B shows a schematic cross-sectional view of a lid assembly in accordance with one or more embodiments of the disclosure.

The contoured bottom surface 160 of the lid plate 170 and the top surface 128 of the gas distribution plate 125 define a gap G. As the bottom surface 160 is contoured, the gap G is variable as a function of distance from the central axis 133. In some embodiments, the inner zone $Z_I$ has a larger gap than the middle zone $Z_M$, and the middle zone $Z_M$ has a larger gap than the outer zone $Z_O$. FIG. 6A shows a schematic cross-sectional view of the lid plate 170 with a contoured bottom surface 160 similar to that shown in FIG. 5. FIG. 6B shows a schematic cross-sectional view of the lid plate 170 and gas distribution plate 125 of FIG. 5 showing the relationship of the gap G to the radial distance from the central axis 133. In FIG. 6A, the contoured bottom surface 160 of the lid plate 170 is separated into three zones: an inner zone $Z_I$; a middle zone $Z_M$; and an outer zone $Z_O$. In this embodiment, in the middle zone $Z_M$ the contoured bottom surface 160 is flat so that the gap GM is uniform. Referring to FIG. 6B, which shows a partial cross-sectional view, the gap GM in the middle zone $Z_M$ is uniform from the left edge to the right edge of the middle zone $Z_M$. In the inner zone $Z_I$, the gap $G_I$ is a function of the distance x measured from the central axis 133. FIG. 6B shows two measurements for the gap $G_I$dx in the inner zone $Z_I$. In the outer zone $Z_O$, the gap $G_O$ is a function of the distance x measured from the central axis 133. One measurement is shown in FIG. 6B for the gap $G_O$dx in the outer zone $Z_O$. The skilled artisan will recognize that the illustrated measurements are for descriptive purposes only. The apertures 126 in the gas distribution plate 125 in FIG. 6B are omitted for descriptive purposes.

Referring again to FIG. 6B, in some embodiments, the inner zone $Z_I$ is defined from a central axis 133 of the lid plate 170 to an inner zone radial distance RI from the central axis 133. The middle zone $Z_M$ is defined from the inner zone radial distance $R_I$ to a middle zone radial distance $R_M$ from the central axis 133. The outer zone $Z_O$ is measured from the middle zone radial distance $Z_M$ to an outer zone radial distance $R_O$ at an outer peripheral edge 137 of the contoured bottom surface 160.

The size of the middle zone $Z_M$ can be any suitable size measured relative to the total radial distance from the central axis 133 to the outer peripheral edge 137. In some embodiments, the distance from the central axis 133 to the outer peripheral edge 137 is greater than or equal to about 50 mm, 100 mm, 150 mm or 200 mm. In some embodiments, the distance from the central axis 133 to the outer peripheral edge 137 is greater than the radius of a substrate to be processed. For example, in an embodiment where a 300 mm substrate is being processed, the radial distance from the central axis to the edge of the substrate is, assuming the substrate is centered, 150 mm. In this example, the distance from the central axis 133 to the outer peripheral edge 137 is greater than or equal to 150 mm.

In some embodiments, the distance from the central axis 133 to the middle zone radial distance $Z_M$ is greater than or equal to about 50 mm, 100 mm, 150 mm or 200 mm. In some embodiments, the distance from the central axis 133 to the middle zone radial distance $Z_M$ is greater than the radius of a substrate to be processed. For example, in an embodiment where a 300 mm substrate is being processed, the radial distance from the central axis to the edge of the substrate is, assuming the substrate is centered, 150 mm. In this example, the distance from the central axis 133 to the middle zone radial distance $Z_M$ is greater than or equal to 150 mm, for example.

In some embodiments, the size of the middle zone $Z_M$ of the lid plate 170 is in the range of about 10% to about 90% of the distance from the central axis to the outer zone radial distance $R_O$. In some embodiments, the size of the middle zone $Z_M$ of the lid plate 170 is in the range of about 20% to about 80%, or in the range of about 30% to about 70%, or in the range of about 40% to about 60% of the distance from the central axis 133 to the outer zone radial distance $R_O$.

In some embodiments, substantially uniform gap in the middle zone $Z_M$ is in the range of about 0.1 inches to about 2 inches (about 2.5 mm to about 51 mm). As used in this manner, the term "substantially uniform gap" means that the gap at any radial distance within the middle zone $Z_M$ is within 5%, 2%, 1% or 0.5% of the average gap in the middle zone $Z_M$.

Figure 7:
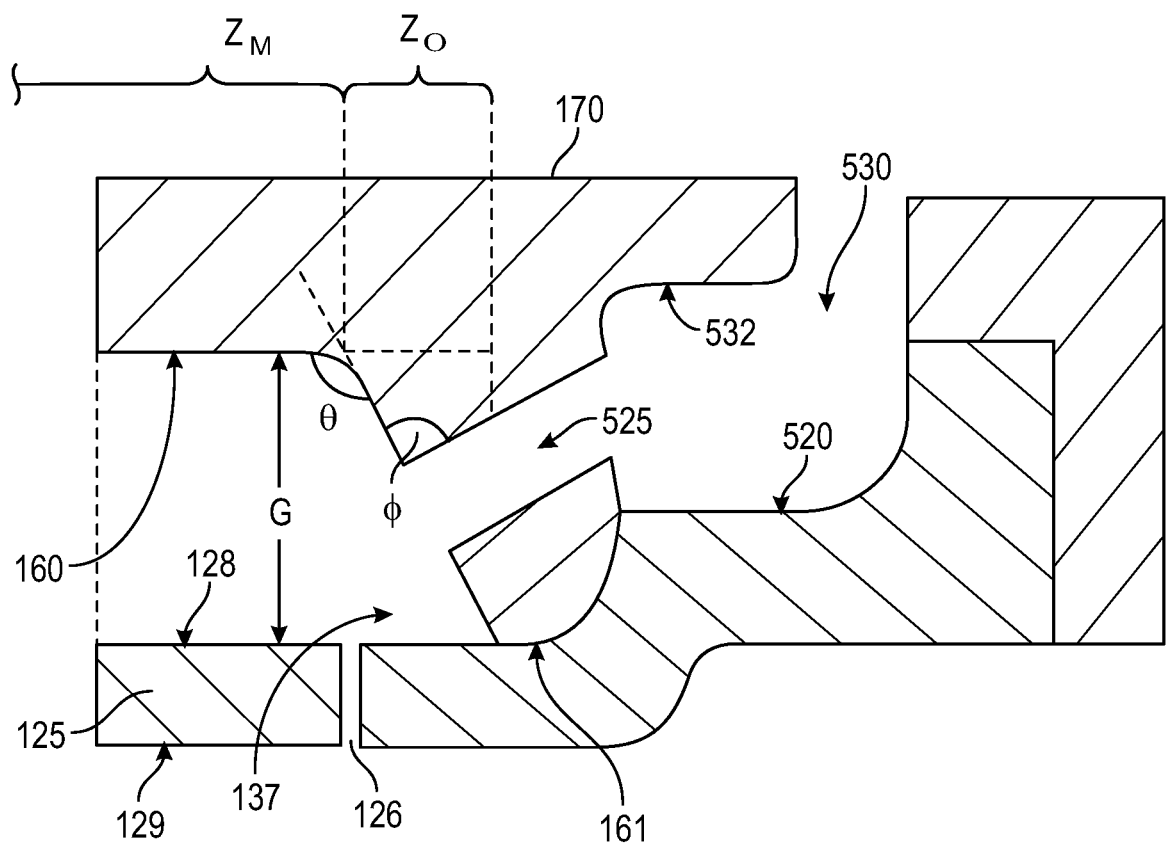
FIG. 7 shows a schematic cross-sectional view of a lid assembly in accordance with one or more embodiment of the disclosure.

In some embodiments, the outer zone $Z_O$ is sloped from the middle zone $Z_M$ to a front face 161 of the lid plate 170. In some embodiments, the outer zone $Z_O$ is sloped from the middle zone $Z_M$ to the top surface 128 of the gas distribution plate 125. The slope of the outer zone $Z_O$ in relation to the flat middle zone $Z_M$ forms an outer zone angle Θ, as shown in FIG. 7. In some embodiments, the outer zone supplementary angle is in the range of about 15° to about 75°, or in the range of about 30° to about 60°, or in the range of about 40° to about 50°. In some embodiments, the outer zone angle is in the range of about 105° to about 165°, or in the range of about 120° to about 150°, or in the range of about 130° to about 140°.

Referring to FIGS. 5 and 7, in some embodiments, the outer zone $Z_O$ of the contoured bottom surface 160 is connected to the pumping channel 530 through pumping holes 525 formed in the lid plate 170. In some embodiments, the pumping holes 525 are formed in the outer zone $Z_O$ of the contoured bottom surface 160. The number of pumping holes 525 can be varied based on, for example, the size of the lid plate 170. In some embodiments, there are in the range of about 24 to about 144 pumping holes 525.

As shown in FIG. 7, the pumping holes intersect the outer zone $Z_O$ of the contoured bottom surface 160 at an angle $\phi$. In some embodiments, the angle $\phi$ is in the range of about 75° to about 105°, or in the range of about 80° to about 100°, or in the range of about 85° to about 95°, or in the range of about 88° to about 92°.

The lid assembly 500 of some embodiments includes at least one pump port 560 in fluid communication with the pumping channel 530, as shown in FIG. 5. The pump port 560 can be a separate component connected to the lid plate 170. In some embodiments, there are two or more pump ports 560 connected to the pumping channel 530 at different radial positions. In some embodiments, each of the pump ports is connected to a separate vacuum source for evacuation purposes. In some embodiments, the pump ports are in fluid communication with a single vacuum source. In some embodiments, the pump ports are in fluid communication with the pumping channel 179 (see FIG. 1).

Figure 8:
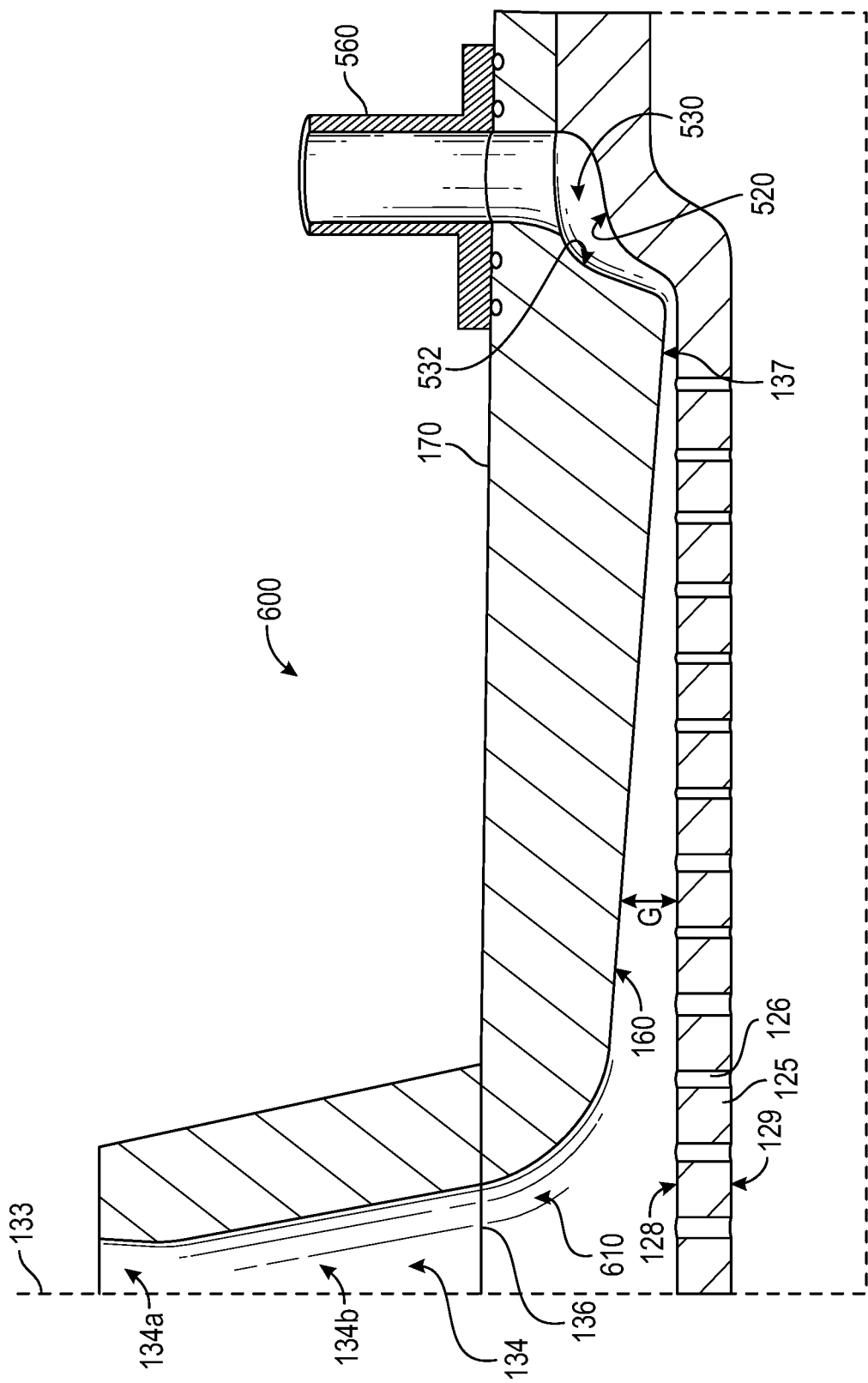
FIG. 8 shows a schematic cross-sectional view of a lid assembly in accordance with one or more embodiment of the disclosure.

FIG. 8 shows a lid assembly 600 in accordance with one or more embodiment of the disclosure. The contoured bottom surface 160 of the lid plate 170 is sloped from an inner edge 610 of the contoured bottom surface 160 to the outer peripheral edge 137.

The slope of the contoured bottom surface 160 creates a gap G that decreases to a minimum at the outer peripheral edge 137. In some embodiments, the minimum gap G is in the range of about 0.01 inches to about 1 inches (about 0.25 mm to about 25.4 mm), or in the range of about 0.05 inches to about 0.5 inches (about 1.25 mm to about 12.7 mm).

Additional embodiments of the disclosure are directed to processing chambers incorporating lid assembly 500 or lid assembly 600.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A process chamber lid assembly comprising:
a lid plate comprising a contoured bottom surface that extends downwardly and outwardly from a central opening around a central axis of the lid plate to a peripheral portion of the lid plate, the contoured bottom surface comprising an inner zone, a middle zone and an outer zone, the inner zone defined from the central axis to an inner zone radial distance from the central axis, the middle zone defined from the inner zone radial distance to a middle zone radial distance, the outer zone defined from the middle zone radial distance to an outer zone radial distance at an outer peripheral edge of the contoured bottom surface, the outer zone sloped from the middle zone radial distance to a front face of the lid plate forming an outer zone angle in the range of 105° to 165°, the outer zone comprising a plurality of pumping holes formed through the lid plate;
a gas distribution plate disposed below the lid plate, the gas distribution plate having an upper outer peripheral contour configured to form a pumping channel between the gas distribution plate and the lid plate, the gas distribution plate having a top surface and a bottom surface with a plurality of apertures disposed through the gas distribution plate from the top surface to the bottom surface; and
at least one pump port through the lid plate and in fluid communication with the pumping channel.

2. The process chamber lid assembly of claim 1, wherein when the gas distribution plate is disposed adjacent the front face of the lid plate, a gap between the inner zone of the contoured bottom surface and the gas distribution plate is larger than a gap between the middle zone of the contoured bottom surface and the gas distribution plate, which is larger than a gap between the outer zone of the contoured bottom surface and the gas distribution plate.

3. The process chamber lid assembly of claim 2, wherein the middle zone of the contoured bottom surface forms a substantially uniform gap.

4. The process chamber lid assembly of claim 3, wherein the substantially uniform gap is in the range of about 0.1 inch to about 2 inches.

5. The process chamber lid assembly of claim 2, wherein the middle zone comprises in the range of about 10% to about 90% of a distance from the central axis to the outer zone radial distance.

6. The process chamber lid assembly of claim 1, wherein the pumping holes intersect the outer zone of the contoured bottom surface at an angle in the range of about 85° to about 95°.

7. The process chamber lid assembly of claim 1, wherein there are in the range of about 24 to about 144 pumping holes in the outer zone.

8. A processing chamber comprising the process chamber lid assembly of claim 1.

9. The processing chamber of claim 8, further comprising a housing enclosing a gas dispersion channel that extends along a central axis of the housing, the gas dispersion channel aligned with the central opening of the lid plate.

10. The processing chamber of claim 9, further comprising a remote plasma source fluidly coupled to the gas dispersion channel.

11. The processing chamber of claim 9, further comprising two pump ports connected to the pumping channel at different radial positions on the lid plate and a vacuum source configured to provide backside pumping to remove trapped chemicals between the lid plate and the gas distribution plate.

12. A processing chamber comprising:
a lid plate comprising a contoured bottom surface that extends downwardly and outwardly from a central opening around a central axis of the lid plate to a peripheral portion of the lid plate, the contoured bottom surface comprising an inner zone, a middle zone and an outer zone, the inner zone defined from the central axis to an inner zone radial distance from the central axis, the middle zone defined from the inner zone radial distance to a middle zone radial distance, the outer zone defined from the middle zone radial distance to an outer zone radial distance at an outer peripheral edge of the contoured bottom surface, the outer zone sloped from the middle zone radial distance to a front face of the lid plate forming an outer zone angle in the range of 105° to 165°, the outer zone comprising a plurality of pumping holes formed through the lid plate;

a gas distribution plate disposed below the lid plate, the gas distribution plate having an upper outer peripheral contour configured to form a pumping channel between the gas distribution plate and the lid plate, the gas distribution plate having a top surface and a bottom surface with a plurality of apertures disposed through the gas distribution plate from the top surface to the bottom surface; and a housing enclosing a gas dispersion channel that extends along a central axis of the housing, the gas dispersion channel aligned with the central opening of the lid plate.

13. The processing chamber of claim 12, wherein when the gas distribution plate is disposed adjacent the front face of the lid plate, a gap between the inner zone of the contoured bottom surface and the gas distribution plate is larger than a gap between the middle zone of the contoured bottom surface and the gas distribution plate, which is larger than a gap between the outer zone of the contoured bottom surface and the gas distribution plate.

14. The processing chamber of claim 13, wherein the middle zone of the contoured bottom surface forms a substantially uniform gap.

15. The processing chamber of claim 14, wherein the substantially uniform gap is in the range of about 0.1 inch to about 2 inches.

16. The processing chamber of claim 13, wherein the middle zone comprises in the range of about 10% to about 90% of a distance from the central axis to the outer zone radial distance.

17. The processing chamber of claim 12, wherein the pumping holes intersect the outer zone of the contoured bottom surface at an angle in the range of about 85° to about 95°.

18. The processing chamber of claim 12, wherein there are in the range of about 24 to about 144 pumping holes in the outer zone.

19. The processing chamber of claim 12, further comprising a remote plasma source fluidly coupled to the gas dispersion channel.

* * * * *